United States Patent
Olariu

(10) Patent No.: US 10,469,062 B2
(45) Date of Patent: Nov. 5, 2019

(54) CIRCUIT AND METHOD FOR REDUCING THE PROPAGATION OF SINGLE EVENT TRANSIENT EFFECTS

(75) Inventor: Viorel Olariu, Colorado Springs, CO (US)

(73) Assignee: Aeroflex Colorado Springs Inc., Colorado Springs, CO (US)

( * ) Notice: Subject to any disclaimer, the term of this patent is extended or adjusted under 35 U.S.C. 154(b) by 1022 days.

(21) Appl. No.: 13/099,723

(22) Filed: May 3, 2011

(65) Prior Publication Data

US 2012/0280736 A1 Nov. 8, 2012

(51) Int. Cl.
*H03K 3/289* (2006.01)

(52) U.S. Cl.
CPC .................................. *H03K 3/289* (2013.01)

(58) Field of Classification Search
CPC .... H03K 3/012; H03K 3/0372; G09G 3/3688; G09G 2300/0408; G11C 2029/1202; G11C 7/22; H01L 2924/00; H01L 2924/0002; H01L 2924/48227; H01L 2924/73265
See application file for complete search history.

(56) References Cited

U.S. PATENT DOCUMENTS

| | | | | |
|---|---|---|---|---|
| 6,433,601 B1* | 8/2002 | Ganesan | .......... | H03K 3/356156 327/202 |
| 7,180,349 B2* | 2/2007 | Leifso | .................. | H03K 23/544 327/199 |
| 2005/0057556 A1* | 3/2005 | Kubota | ................ | G09G 3/3677 345/211 |
| 2009/0256596 A1* | 10/2009 | Oh | ................................ | 327/115 |

* cited by examiner

*Primary Examiner* — Sibin Chen
(74) *Attorney, Agent, or Firm* — Hogan Lovells US LLP

(57) ABSTRACT

Circuits and a corresponding method are used to eliminate or greatly reduce SET induced glitch propagation in a radiation hardened integrated circuit. A clock distribution circuit and an integrated circuit portioning can be radiation hardened using one or two latch circuits interspersed through the integrated circuit, each having two or four latch stages.

6 Claims, 8 Drawing Sheets

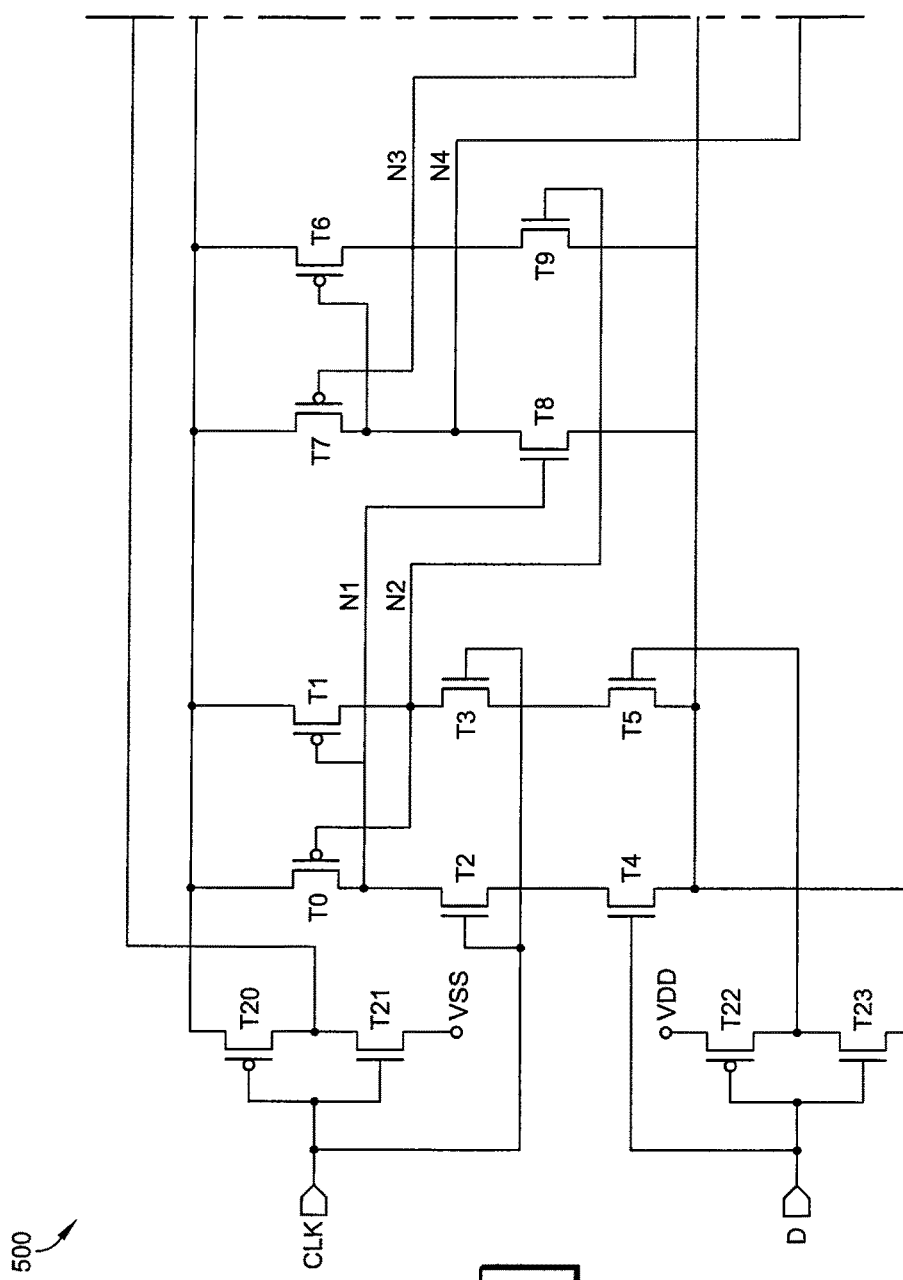

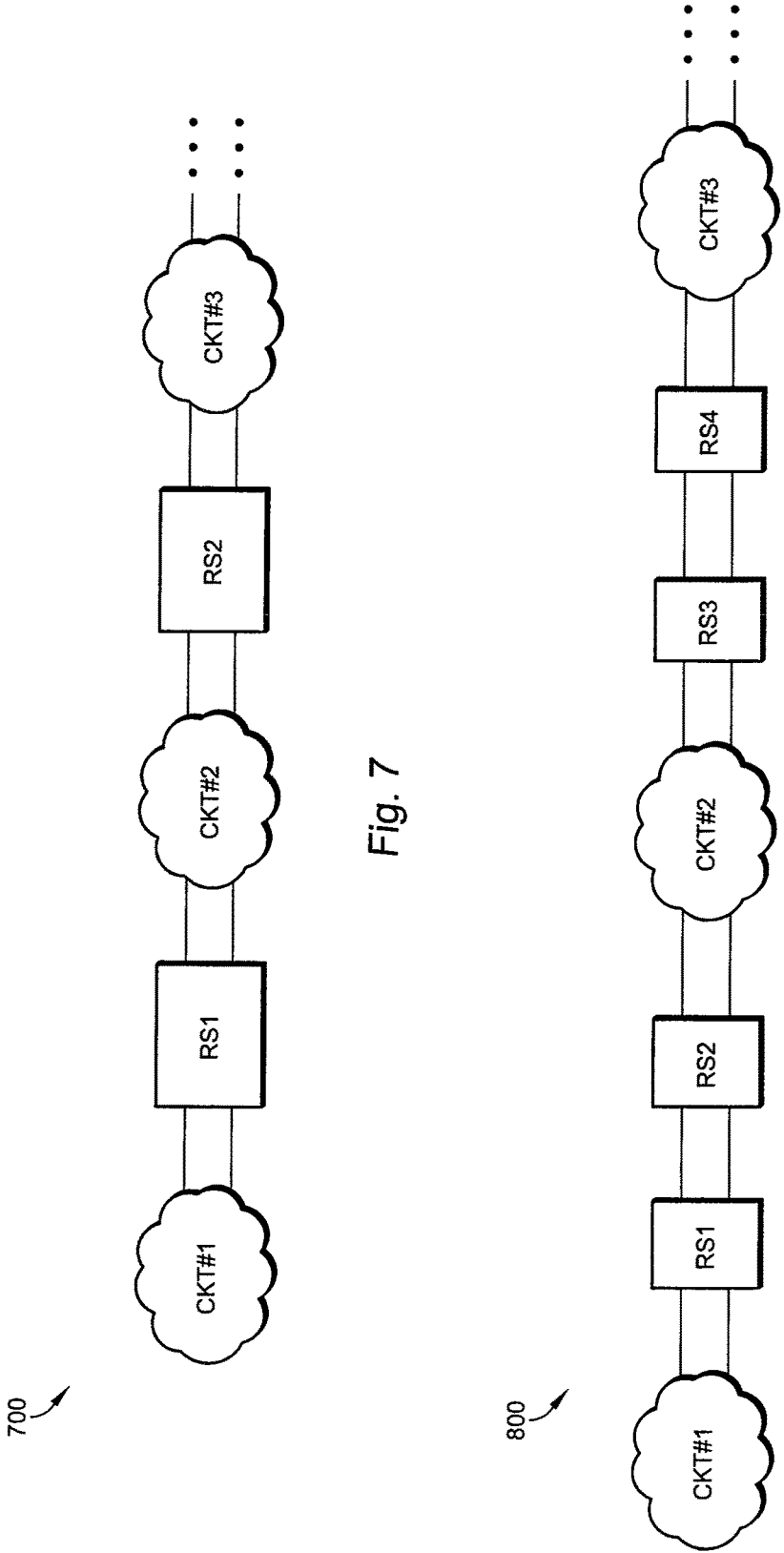

US 10,469,062 B2

CIRCUIT AND METHOD FOR REDUCING THE PROPAGATION OF SINGLE EVENT TRANSIENT EFFECTS

BACKGROUND OF THE INVENTION

1. Field of the Invention

This invention relates to radiation-hardened circuits, and more particularly to a radiation-hardened latch circuit for reducing the propagation of pulses and other effects caused by single event transients.

2. Discussion of the Related Art

Single event transients ("SET") can cause voltage glitches and pulses to be generated within an integrated circuit, thus causing disruption and degradation of performance by, for example, undesired switching of circuit blocks. These pulses and glitches can further propagate throughout the integrated circuit causing even further disruption and degradation of performance.

What is desired, therefore, is a method and circuit that is itself radiation-hardened and will eliminate or at least substantially reduce the propagation of voltage pulses or glitches throughout the integrated circuit caused by the SET event.

BRIEF SUMMARY OF THE INVENTION

According to a first embodiment of the present invention, a radiation hardened latch circuit comprises a first latch stage having a first input for receiving a data signal, a second input for receiving a clock signal, and an output, and a second latch stage having a first input coupled to the output of the first latch stage, a second input for receiving an inverted clock signal, and an output for providing an output signal. The first latch stage comprises a first N-channel cascode stage coupled to the first input thereof, a second N-channel cascode stage coupled to the second input thereof, and a cross-coupled P-channel cascode stage coupled to the output thereof. The second latch stage comprises a first N-channel cascode stage coupled to the first input thereof, a second N-channel cascode stage coupled to the second input thereof, and a cross-coupled P-channel cascode stage coupled to the output thereof. The first and second inputs of the first and second latch stages comprise differential inputs.

According to a second embodiment of the present invention, a radiation hardened latch circuit comprises a first latch stage having a first input for receiving a data signal, a second input for receiving a clock signal and an output, a second latch stage having an input-coupled to the output of the first latch stage and an output, a third latch stage having a first input coupled to the output of the second latch stage, a second input for receiving an inverted clock signal and an output, and a fourth latch stage having an input coupled to the output of the third latch stage and an output for providing an output signal. The first and third latch stages each comprise a first N-channel cascode stage coupled to the first input thereof, a second N-channel cascode stage coupled to the second input thereof, and a cross-coupled P-channel cascode stage coupled to the output thereof. The second and fourth latch stages each comprise an N-channel cascode stage coupled to the input thereof, and a cross-coupled P-channel cascode stage coupled to the output thereof. The first and second inputs of the first and third latch stages comprise differential inputs.

According to a third embodiment of the present invention, a radiation hardened signal distribution circuit comprises a plurality of serially coupled latch circuits having an input for receiving an input signal, an output for providing an output signal, and an intermediate node for providing a tap signal. Each latch circuit comprises two or four latch stages, and the input signal can comprise a clock signal.

According to a fourth embodiment of the present invention, a radiation hardened integrated circuit comprises a plurality of integrated circuit portions each for providing a standalone circuit function, and a plurality of latch circuits not associated with the standalone circuit function for interconnecting the plurality of circuit portions. The latch circuit can comprise a single latch circuit, or two serially-coupled latch circuits. In turn, the latch circuits can comprise two or four latch stages.

According to a method of the present invention, radiation hardening an integrated circuit comprises providing a plurality of standalone circuit functions with a plurality of integrated circuit portions, and interconnecting the plurality of integrated circuit portions with a plurality of latch circuits not associated with the standalone circuit function. The latch circuits can comprise two or four latch stages.

BRIEF DESCRIPTION OF THE DRAWING FIGURES

The invention, together with its various features and advantages and other aspects, can be readily understood from the following more detailed description taken in conjunction with the accompanying drawing figures, in which:

FIG. 7 is a block diagram of a first circuit partitioning for reducing SET glitches in an integrated circuit according to the present invention; and FIG. 8 is a block diagram of a second circuit partitioning for reducing SET glitches in an integrated circuit according to the present invention.

DETAILED DESCRIPTION

Figure 1:
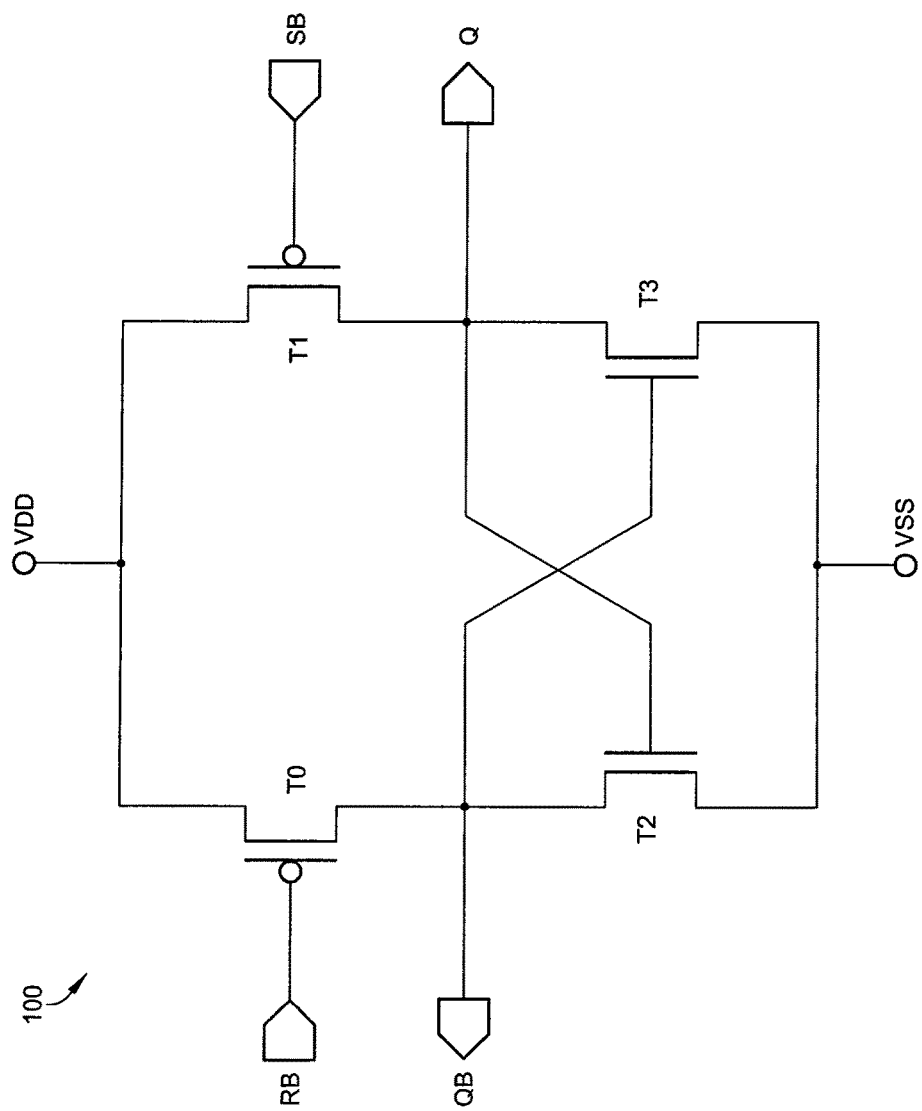
FIG. 1 is a schematic of a first RS latch circuit according to the prior art.

Referring now to FIG. 1, an RS latch 100 according to the prior art is shown. A P-channel transistor T0 has a source coupled to VDD, a gate coupled to an RB input, and a drain coupled to a QB output. A P-channel transistor T1 has a source coupled to VDD, a gate coupled to an SB input, and a drain coupled to a Q output. Transistors T2 and T3 form a cross-coupled pair. The N-channel transistor T2 has a source coupled to VSS, a gate coupled to the Q output, and a drain coupled to the QB output. The N-channel transistor T3 has a source coupled to VSS, a gate coupled to the QB output, and a drain coupled to the Q output.

The logic state diagram for RS latch 100 is given below:

| Mode | RB | SB | $Q_{N+1}$ | $QB_{N+1}$ |
|---|---|---|---|---|
| N/A | 0 | 0 | 1 | 1 |
| NORMAL | 0 | 1 | 1 | 0 |
| NORMAL | 1 | 0 | 0 | 1 |
| NOOP | 1 | 1 | $Q_N$ | $QB_N$ |

It was observed by the inventor that the NOOP mode of operation wherein the RB and SB inputs are both high and the N/A mode of operation wherein the RB and SB inputs are both low could be used to stop the propagation of an errant input signal caused by an SET event. Errant pulses or glitches on the RB and SB inputs do not propagate past the output of the RS latch.

Figure 2:
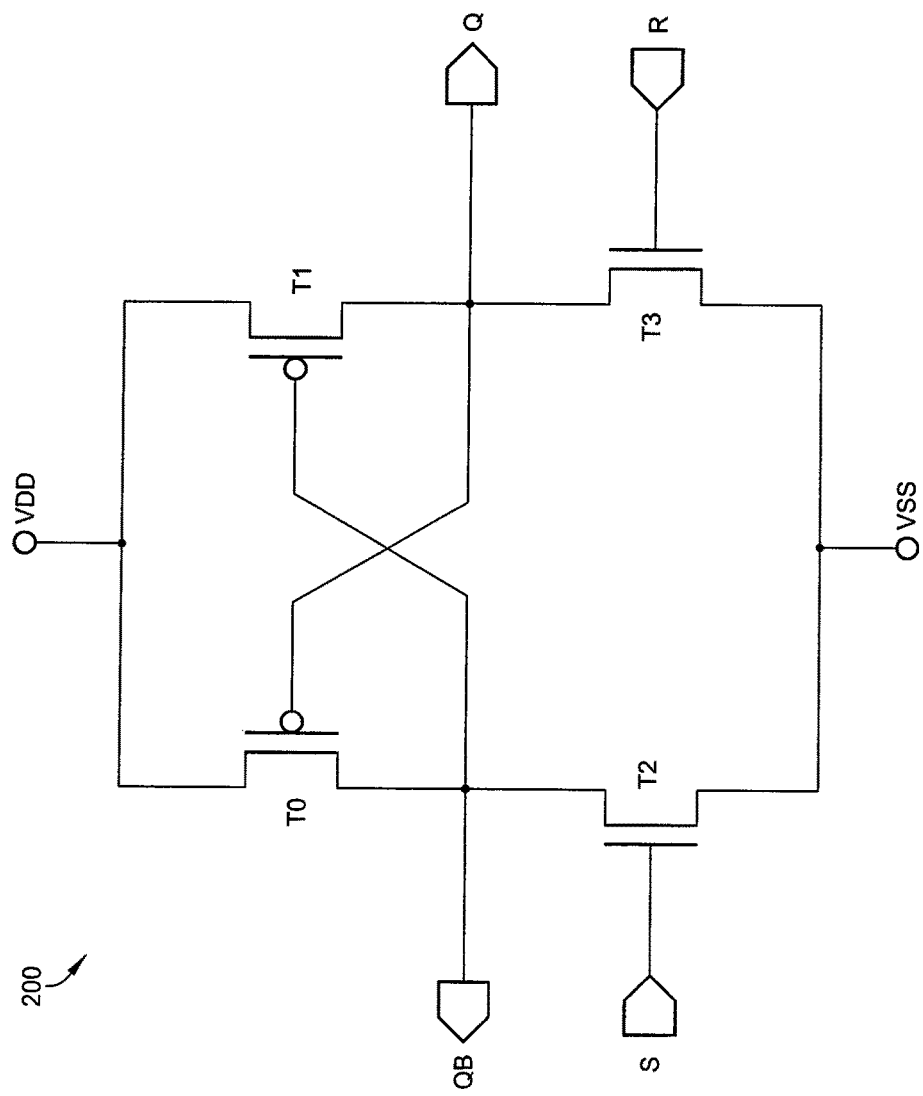
FIG. 2 is a schematic of a second RS latch circuit according to the prior art.

Referring now to FIG. 2, an RS latch 200 according to the prior art is shown. Transistors T0 and T1 form a cross-coupled pair. The P-channel transistor T0 has a source coupled to VDD, a gate coupled to a Q output, and a drain coupled to a QB output. The P-channel transistor T1 has a source coupled to VDD, a gate coupled to the QB output, and a drain coupled to the Q output. An N-channel transistor T2 has a source coupled to VSS, a gate coupled to an S input, and a drain coupled to the QB output. An N-channel transistor T3 has a source coupled to VSS, a gate coupled to an R input, and a drain coupled to the Q output.

The logic state diagram for RS latch 200 is given below:

| Mode | R | S | $Q_{N+1}$ | $QB_{N+1}$ |
|---|---|---|---|---|
| NOOP | 0 | 0 | $Q_N$ | $QB_N$ |
| NORMAL | 0 | 1 | 1 | 0 |
| NORMAL | 1 | 0 | 0 | 1 |
| N/A | 1 | 1 | 0 | 0 |

It was similarly observed by the inventor that the N/A mode of operation wherein the R and S inputs are both high and the NOOP mode of operation wherein the R and S inputs are both low could be used to stop the propagation of an errant input signal caused by an SET event. Errant pulses or glitches on the R and S inputs do not propagate past the output of the RS latch.

Figure 3A:
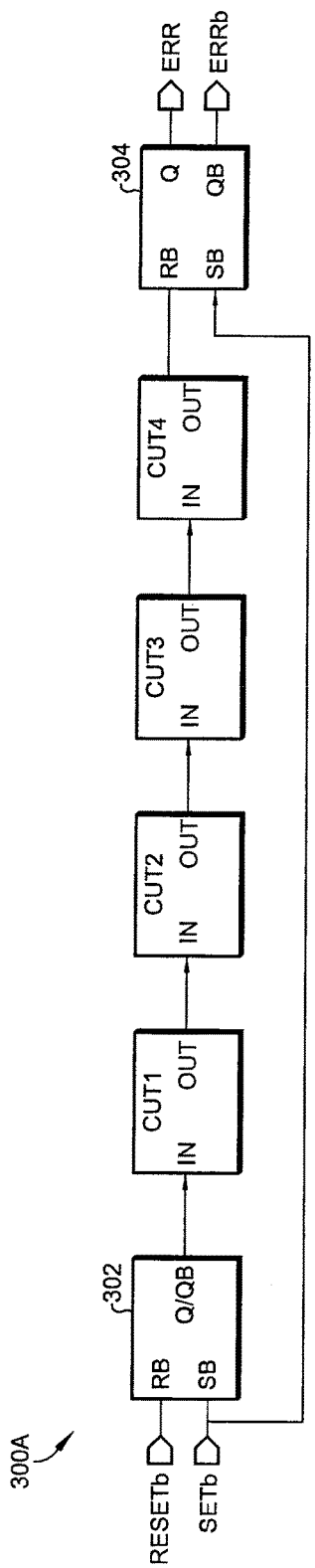
FIG. 3A is a schematic of a first test circuit according to the present invention.

According to the present invention, a first test circuit 300A is shown in FIG. 3A for measuring the error rate for injected pulses. Test circuit 300 includes a first RS latch 302, a last RS latch 304, and plurality of serially coupled circuits under test (CUT) CUT1, CUT2, CUT3, and CUT4. While two RS latches and four CUTs are shown in test circuit 300, any number of CUTs could be used. The Q output of latch 302 is coupled to the inputs of CUT1. The output of a CUT (CUT1, for example) is coupled to the input of the next CUT in the chain (CUT2, for example). A first latch 302 has an RB input coupled to the Resetb input of the test circuit, and an SB input coupled to the Setb input of the test circuit. A last latch 304 has an RB input coupled to the output of CUT4, an SB input coupled to the Setb input of the test circuit, a Q output coupled to the Err output of the test circuit, and a QB output coupled to the Errb output of the test circuit. In operation, the test circuit 300A is used to test the SET sensitivity of various circuits.

Figure 3B:
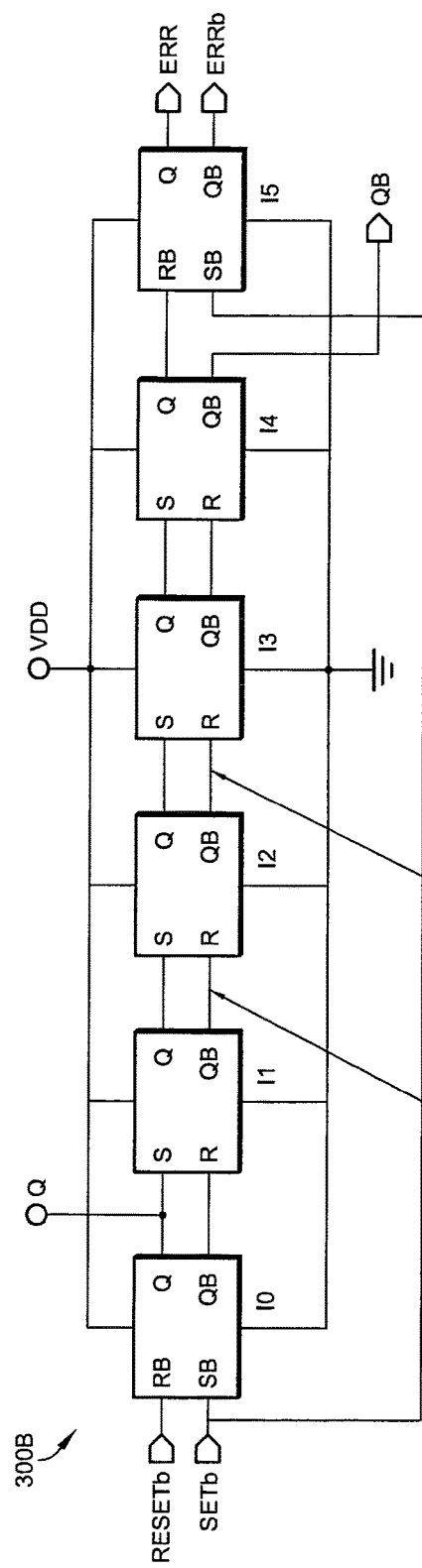
FIG. 3B is a schematic of a second test circuit according to the present invention.

According to the present invention, a second test circuit 300B is shown in FIG. 3B for measuring the error rate for injected pulses. Test circuit 300B includes a plurality of serially coupled RS latches I0, I1, I2, I3, I4, and I5. While six RS latches are shown in test circuit 300B, any number of latches could be used. The Q and QB outputs of each latch are coupled to the S and R inputs of the next latch in the chain. A first latch I0 has an RB input coupled to the Resetb input of the test circuit, and an SB input coupled to the Setb input of the test circuit. A last latch I5 has an RB input coupled to the Q output of latch I4, an SB input coupled to the Setb input of the test circuit, a Q output coupled to the Err output of the test circuit, and a QB output coupled to the Errb output of the test circuit. A SET pulse injection point for positive going pulses is at the R input of latch I2. A SET pulse injection point for negative going pulses is at the S input of latch I3. In operation, the test circuit 300B is also used to test the SET sensitivity of various circuits.

While an ordinary prior art RS latch could be used for the purpose of stopping glitches from propagating throughout an integrated circuit, the RS latch itself should be radiation hardened. That is to say, the RS latch of the prior art will be ineffective for stopping glitch propagation if it is directly hit by an SET event.

Figure 4:
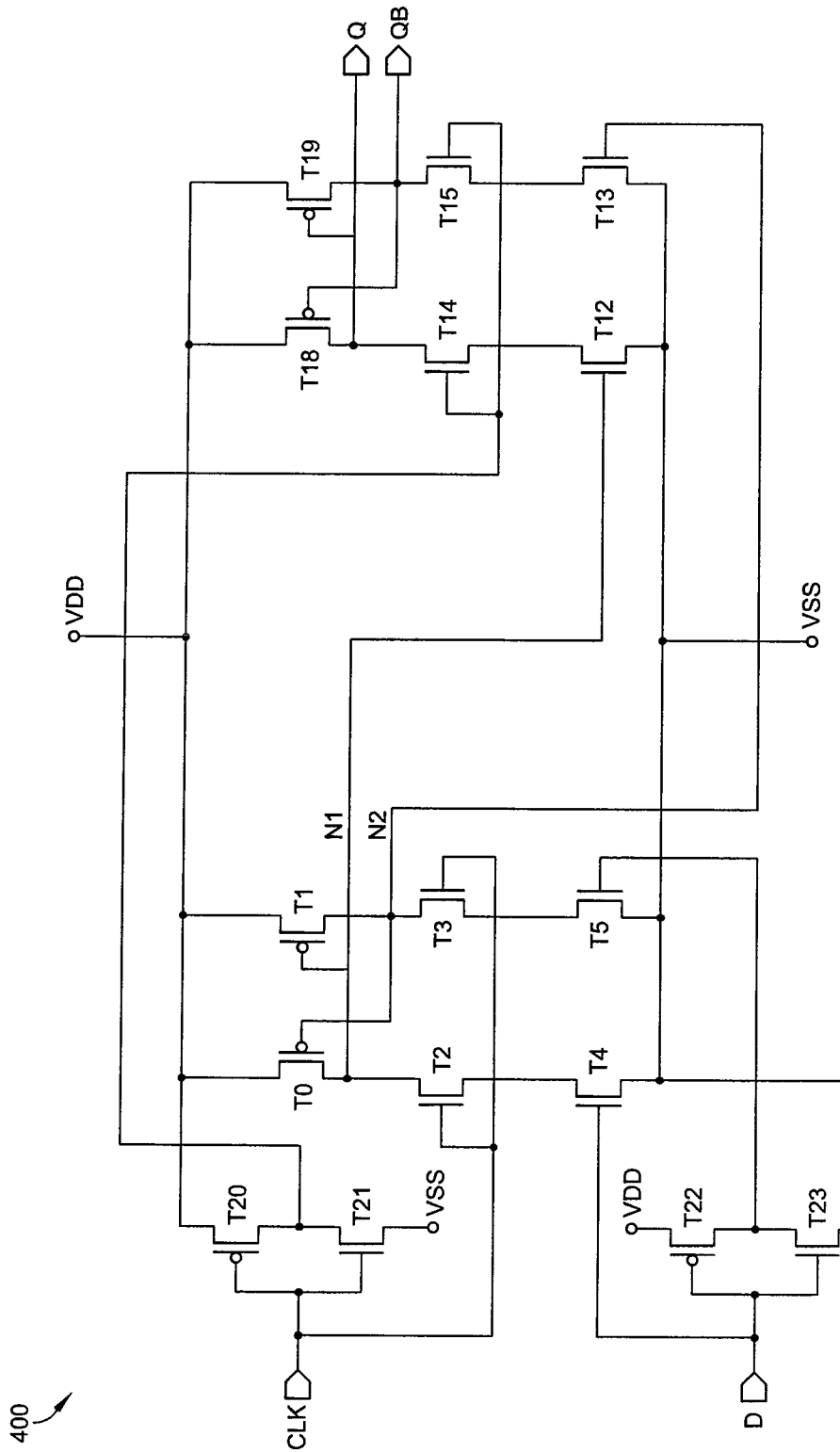
FIG. 4 is a schematic of a first latch circuit having two latch stages according to the present invention.

According to an embodiment of the present invention, a radiation hardened latch circuit 400 is shown in FIG. 4 wherein a first latch stage T0, T1, T2, T3, T4, T5, has a first input for receiving a D data signal directly and through inverter T22, T23, a second input for receiving a CLK clock signal, and an output N1, N2. A second latch stage T12, T13, T14, T15, T18, T19 has a first input coupled to the output of the first latch stage, a second input for receiving an inverted clock signal through inverter T20, T21, and an output for providing an output signal Q, QB. The first latch stage comprises a first N-channel cascode stage T4, T5 coupled to the first input thereof, a second N-channel cascode stage coupled to the second input thereof T2, T3, and a cross-coupled P-channel cascode stage T0, T1 coupled to the output thereof. The second latch stage comprises a first N-channel cascode stage T12, T13 coupled to the first input thereof, a second N-channel cascode stage T14, T15 coupled to the second input thereof, and a cross-coupled P-channel cascode stage T18, T19 coupled to the output thereof. As can be seen in FIG. 4, the first and second inputs of the first and second latch stages comprise differential inputs. The outputs of the first and second latch stages are also differential outputs.

Figure 5B:
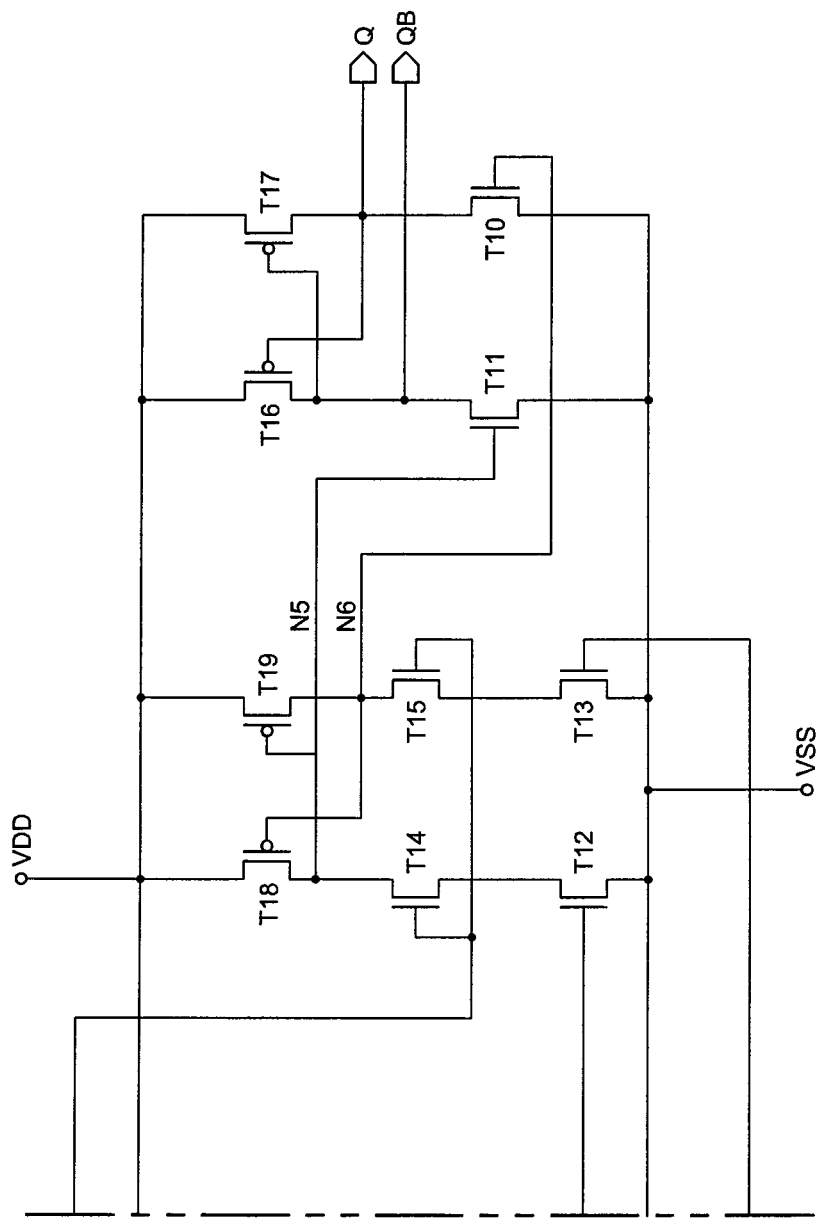
FIG. 5 is a schematic of a second latch circuit having four latch stages according to the present invention.

According to an embodiment of the present invention, a radiation hardened latch circuit 500 is shown in FIG. 5 wherein a first latch stage T0, T1, T2, T3, T4, and T5 has a first input for receiving a data signal directly and through inverter T22, T23, a second input for receiving a CLK clock signal, and an output N1, N2. A second latch stage T6, T7, T8, T9 has an input coupled to the output of the first latch stage, and an output N3, N4. A third latch stage T12, T13, T14, T15, T18, T19 has a first input coupled to the output of the second latch stage, a second input for receiving an inverted clock signal through inverter T20, T21, and an output N5, N6. A fourth latch stage T10, T11, T16, T17 has an input coupled to the output of the third latch stage, and an output Q, QB for providing an output signal. The first and third latch stages each comprise a first N-channel cascode stage coupled to the first input thereof, a second N-channel cascode stage coupled to the second input thereof, and a cross-coupled P-channel cascode stage coupled to the output thereof. The second and fourth latch stages each comprise an N-channel cascode stage coupled to the input thereof, and a cross-coupled P-channel cascode stage coupled to the output thereof. The first and second inputs of the first and third latch stages comprise differential inputs. The first and third latch stages also comprise differential outputs. The second and fourth latch stages have differential inputs and outputs.

Figure 6A:
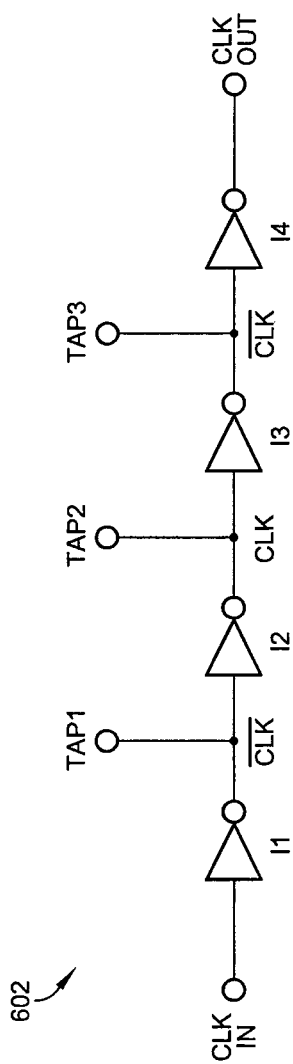
FIG. 6A is a schematic of a clock distribution circuit according to the prior art.

Referring now to FIG. 6A, a prior art clock distribution circuit 602 is shown including a plurality of inverters I1 through I4. Any number of inverters can be used as is known in the art. A first inverter I1 receives a CLK IN input signal, and a last inverter I4 provides a CLK OUT output signal. Intermediate tap nodes TAP1, TAP2, and TAP3 provide the clock signal or inverted clock signals as is known in the art. The clock distribution circuit 602 is adequate for providing a plurality of clock signals throughout an integrated circuit. However, once generated SET induced glitches will propagate from the generation point throughout the entire circuit.

Figure 6B:
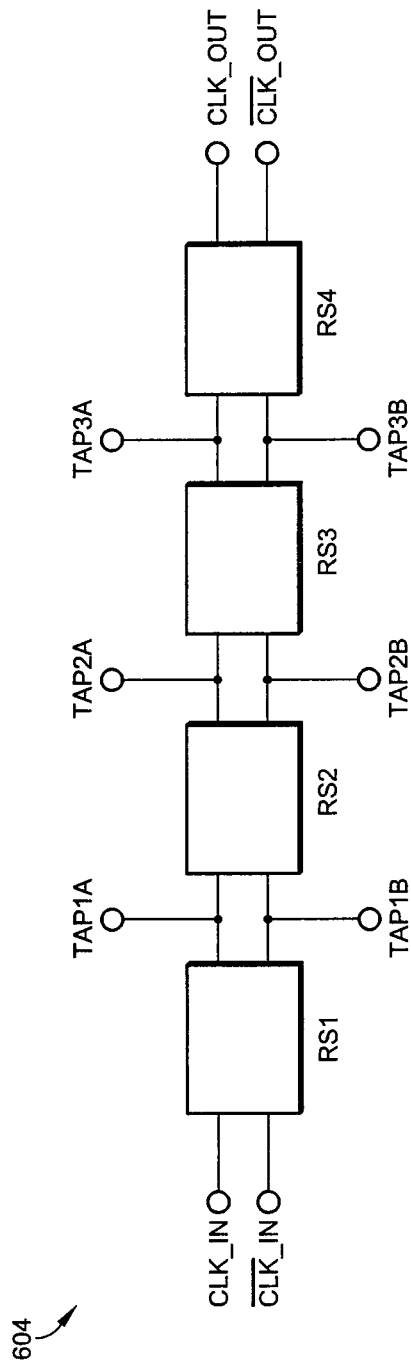
FIG. 6B is a schematic of a clock distribution circuit according to the present invention.

Referring now to FIG. 6B a radiation hardened signal distribution circuit 604 according to the present invention comprises a plurality of serially coupled latch circuits RS1, RS2, RS3, and RS4. A first latch RS1 has an input for receiving an input signal CLK IN and CLKB IN. A last latch RS4 has an output for providing an output signal CLK OUT and CLKB OUT. A plurality of intermediate nodes provide clock and inverted clock tap signals TAP1A, TAP1B, TAP2A, TAP2B, TAP3A, and TAP3B. While requiring additional circuitry, the clock distribution circuit of FIG. 6B has the advantage that any SET induced glitches are stopped at least at the next latch stage and do not propagate further through the latch chain. Each latch circuit can comprise one or more latch stages as simple as shown in FIG. 1 or FIG. 2 or more complex latches as shown in FIG. 4 or FIG. 5. Each latch circuit can comprise two latch stages as was shown with respect to latch circuit 400 shown in FIG. 4 for additional radiation hardening. Each latch stage can also comprise four latch stages as was shown with respect to latch circuit 500 shown in FIG. 5 for still further additional radiation hardening. While an input clock signal is shown in FIG. 6B other types of input signals can of course be distributed as desired.

Referring now to FIG. 7, a radiation hardened integrated circuit 700 comprises a plurality of integrated circuit portions CKT #1, CKT #2, CKT #3, each for providing a standalone circuit function. A plurality of single latch circuits RS1, RS2 not associated with the standalone circuit function are provided for interconnecting the plurality of circuit portions. The additional single latch circuits RS1, RS2 are used solely for stopping the propagation of SET induced glitches as previously discussed. Each one of the single latch circuits can include two or four latch stages for additional radiation hardening as previously discussed.

Referring now to FIG. 8, a radiation hardened integrated circuit 800 comprises a plurality of integrated circuit portions CKT #1, CKT #2, CKT #3, each for providing a standalone circuit function. A plurality of two serially-coupled latch circuits RS1, RS2 and RS3, RS4 not associated with the standalone circuit function are provided for interconnecting the plurality of circuit portions. The additional latch circuits RS1, RS2 and RS3, RS4 are used solely for stopping the propagation of SET induced glitches as previously discussed. Each one of the latch circuits can include two or four latch stages for additional radiation hardening as previously discussed.

A method of radiation hardening an integrated circuit has been shown comprising providing a plurality of standalone circuit functions with a plurality of integrated circuit portions, and interconnecting the plurality of integrated circuit portions with a plurality of latch circuits not associated with the standalone circuit function.

It is to be understood that the above-described circuits, embodiments, and drawing figures are merely illustrative of the many possible specific embodiments that can be devised to represent applications of the principles of the present invention. Numerous and varied other arrangements can be devised in accordance with these principles by those skilled in the art without departing from the spirit and scope of the invention. For example, the exact details of the circuit topography, component values, power supply values, as well as other details may be obviously changed to meet the specifications of a particular application.

I claim:

1. A radiation hardened latch circuit comprising:
   a first latch stage comprising a first N-channel cascode stage, a second N-channel cascode stage, and a first cross-coupled P-channel transistor pair, wherein the drain terminals of the first N-channel cascode stage are connected to the source terminals of the second N-channel cascode stage and the drain terminals of the second N-channel cascode stage are connected to the drain terminals of the first cross-coupled P-channel transistor pair; and
   a second latch stage comprising a third N-channel cascode stage, a fourth N-channel cascode stage, and a second cross-coupled P-channel transistor pair, wherein the drain terminals of the third N-channel cascode stage are connected to the source terminals of the fourth N-channel cascode stage and the drain terminals of the fourth N-channel cascode stage are connected to the drain terminals of the second cross-coupled P-channel transistor pair;
   wherein the first N-channel cascode stage is coupled to a first signal input and an inverted first signal input;
   wherein the second N-channel cascode stage is coupled to a clock signal;
   wherein the drain terminals of the first cross-coupled P-channel transistor pair are directly coupled to a first latch stage output;
   wherein the first latch stage output is coupled to the third N-channel cascode stage; and
   wherein the drain terminals of the second cross-coupled P-channel transistor pair are coupled to and a second latch stage differential output.

2. A radiation hardened latch circuit comprising:
   a first latch stage comprising a first latch stage data input, a first clock signal input, a first cross-coupled P-channel transistor pair, and a first latch stage output;
   a second latch stage comprising a second latch stage input and a second latch stage output;
   a third latch stage comprising a third latch stage data input, an inverted clock signal input, and a third latch stage output; and
   a fourth latch stage;
   wherein the first cross-coupled P-channel transistor pair is directly coupled to the second latch stage input;
   wherein the second latch stage comprises a P-channel transistor pair, but not an N-channel cascode stage and the second latch stage output is directly coupled to the third latch stage data input;
   wherein the third latch stage comprises a P-channel transistor pair and at least one N-channel cascode stage and the third latch stage output is directly coupled to the fourth latch stage; and
   the fourth latch stage comprises a P-channel transistor pair, but not an N-channel cascode stage.

3. The radiation hardened latch circuit of claim 2, wherein the first latch stage receives the first data signal input directly through an inverter.

4. The radiation hardened latch circuit of claim 2, wherein the first latch stage data input and the third latch stage data input comprise differential inputs.

5. The radiation hardened latch circuit of claim 2, wherein the first latch stage output and the third latch stage output comprise differential outputs.

6. The radiation hardened latch circuit of claim 2, wherein the second latch stage input is a differential input and the second latch stage output is a differential output.

* * * * *